United States Patent
Lee et al.

(10) Patent No.: US 12,412,695 B2
(45) Date of Patent: Sep. 9, 2025

(54) MAGNETIC DEVICE AND THE METHOD TO MAKE THE SAME

(71) Applicant: CYNTEC CO., LTD., Hsinchu (TW)

(72) Inventors: Chi-Hsun Lee, Taipei (TW); Min-Feng Chung, Taichung (TW)

(73) Assignee: CYNTEC CO., LTD., Hsinchu (TW)

( * ) Notice: Subject to any disclaimer, the term of this patent is extended or adjusted under 35 U.S.C. 154(b) by 993 days.

(21) Appl. No.: 17/508,940

(22) Filed: Oct. 22, 2021

(65) Prior Publication Data

US 2022/0130599 A1  Apr. 28, 2022

Related U.S. Application Data

(60) Provisional application No. 63/104,530, filed on Oct. 23, 2020.

(51) Int. Cl.

| | |
|---|---|
| *H01F 27/28* | (2006.01) |
| *H01F 27/02* | (2006.01) |
| *H01F 27/24* | (2006.01) |
| *H01F 27/26* | (2006.01) |
| *H01F 27/29* | (2006.01) |
| *H01F 27/36* | (2006.01) |
| *H01F 41/00* | (2006.01) |
| *H01F 41/02* | (2006.01) |
| *H01F 41/04* | (2006.01) |
| *H01L 25/16* | (2023.01) |
| *H10D 1/20* | (2025.01) |

(52) U.S. Cl.
CPC ........... *H01F 27/29* (2013.01); *H01F 27/022* (2013.01); *H01F 27/24* (2013.01); *H01F 27/266* (2013.01); *H01F 27/2804* (2013.01); *H01F 27/2823* (2013.01); *H01F 27/288* (2013.01); *H01F 27/363* (2020.08); *H01F 41/005* (2013.01); *H01F 41/02* (2013.01); *H01F 41/04* (2013.01); *H01L 25/16* (2013.01); *H10D 1/20* (2025.01)

(58) Field of Classification Search
CPC ........ H01F 27/29; H01F 27/022; H01F 27/24; H01F 27/266; H01F 27/2804; H01F 27/2823; H01F 27/288; H01F 27/363; H01F 41/005; H01F 41/02; H01F 41/04; H01F 17/04; H01F 27/292; H01F 2017/048; H01F 41/00; H01L 25/16; H01L 28/10
USPC ......................................... 336/192, 200, 232
See application file for complete search history.

(56) References Cited

U.S. PATENT DOCUMENTS

| | | | |
|---|---|---|---|
| 2015/0116891 A1* | 4/2015 | Park ........................ | H01G 4/40 361/270 |
| 2019/0180930 A1* | 6/2019 | Yazaki ................. | H05K 1/0233 |
| 2020/0027649 A1* | 1/2020 | Yang ..................... | H01F 27/361 |
| 2021/0057138 A1* | 2/2021 | Yang ..................... | H01F 41/041 |

* cited by examiner

*Primary Examiner* — Shawki S Ismail
*Assistant Examiner* — Kazi S Hossain
(74) *Attorney, Agent, or Firm* — Min-Lee Teng

(57) ABSTRACT

A recess is formed on a bottom surface of a body of an inductor, wherein an electrode for connecting to a ground is disposed in the recess, and an electrode connecting with a coil of the inductor is disposed on a protruding portion adjacent to the recess.

9 Claims, 7 Drawing Sheets

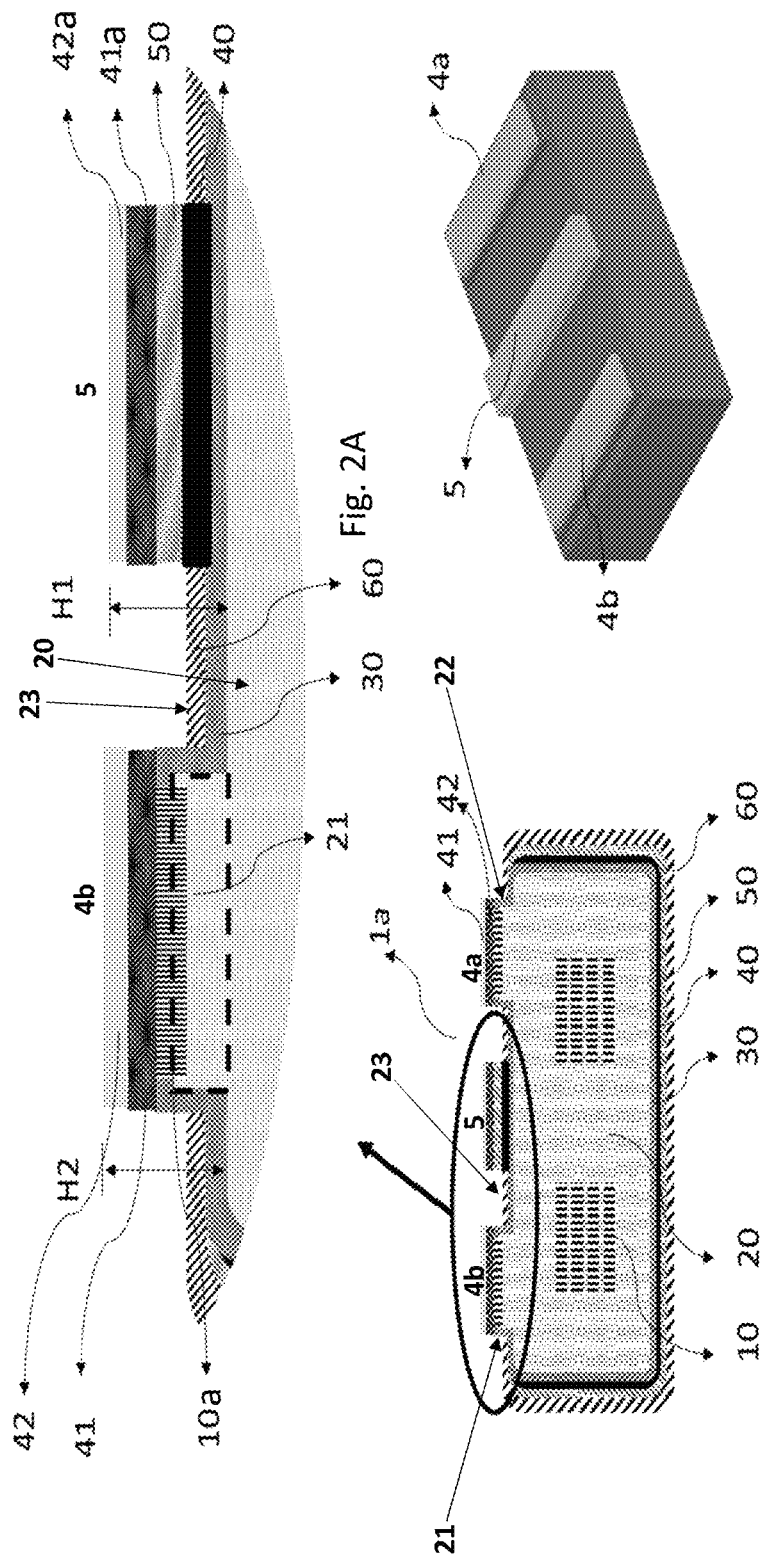

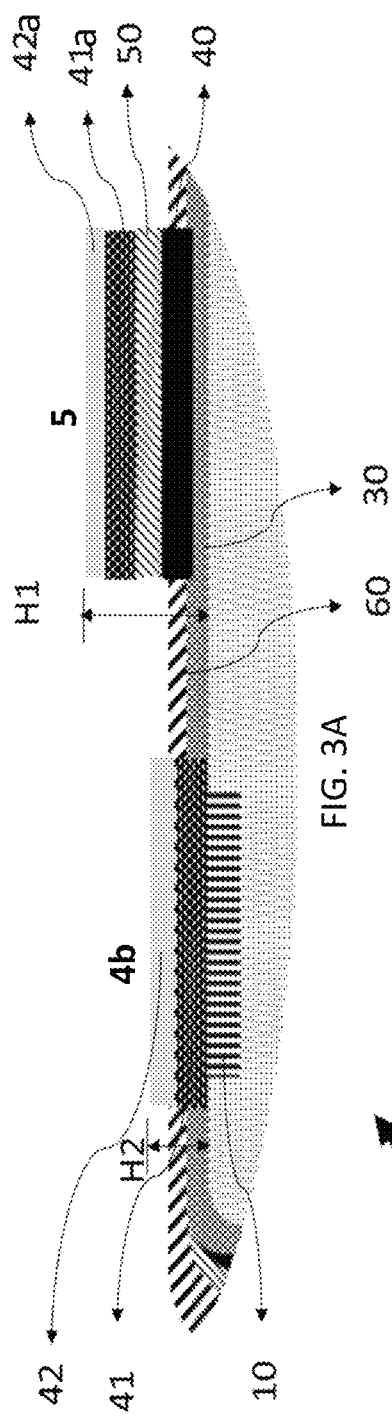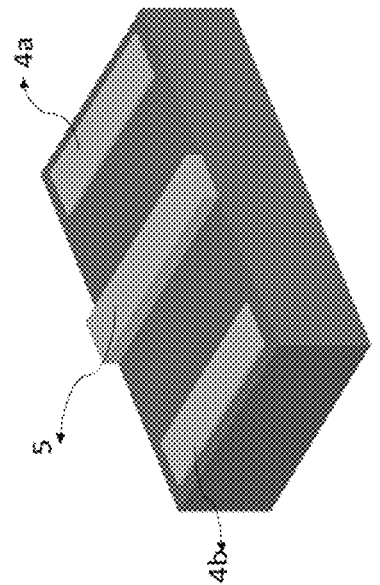
FIG. 3A
FIG. 3B
FIG. 3C

S501: providing a magnetic device having a body, wherein a coil made of a conductive wire is disposed in the body S502: forming a first electrode and a second electrode on a first portion and a second portion of the body, respectively, wherein the first electrode and the second electrode are electrically connected to two terminal parts of the conductive wire S503: forming a third electrode for electrically connecting to a ground, wherein a peak surface of the third electrode has a first height H1 and a peak surface of the first electrode has a second height H2, relative to a horizonal plane, wherein the difference between H1 and H2 is less than 50um

FIG. 5

| Coplanarity H1 | | H2 | | Coplanarity H1 | | H2 | |
|---|---|---|---|---|---|---|---|
| 0~50um | >30um | >20um | | 0~50um | >30um | >20um | |
| Max | 50 | 70 | 34 | 45 | 70 | 36 |
| Avg | 31 | 61 | 30 | 31 | 62 | 31 |
| Min | 27 | 49 | 20 | 26 | 46 | 25 |
| | PASS | | | PASS | | |

Fig. 6

MAGNETIC DEVICE AND THE METHOD TO MAKE THE SAME

CROSS-REFERENCES TO RELATED APPLICATIONS

This application claims the benefit of U.S. Provisional Patent Application No. 63/104,530 filed Oct. 23, 2020, which is hereby incorporated by reference herein and made a part of the specification.

BACKGROUND OF THE INVENTION

I. Field of the Invention

The present invention relates to a magnetic device, and in particular, to an inductor having a ground electrode.

II. Description of Related Art

In a conventional magnetic device such as an inductor, the height of the ground electrode is much higher than the height of the electrodes of the inductor, which affects the coplanarity between the ground electrode and the electrodes of the inductor, and will therefore cause soldering failures when soldering all of the above electrodes with an external circuit.

Therefore, a better solution is needed to resolve the above-mentioned issues.

SUMMARY OF THE INVENTION

One objective of the present invention is to form a structure of electrodes of a magnetic device so as to enhance the soldering quality.

One objective of the present invention is to form a structure of electrodes of an inductor to enhance the soldering quality.

In one embodiment of the present invention, a magnetic device is disclosed, wherein the magnetic device comprises: a body, having a first surface, wherein a recess is form on the first surface with a first protruding portion and a second protruding portion of the body being located at two opposite sides of the recess, wherein the first portion, the second portion and the recess are at a same side of the body, wherein a conductive wire is disposed in the body; a first electrode and a second electrode, wherein the first electrode is disposed over the first protruding portion and the second electrode is disposed on the second protruding portion, wherein the first electrode and the second electrode are electrically connected to two terminal parts of the conductive wire; and a third electrode, for electrically connecting to a ground, wherein the third electrode comprises a plurality of conductive layers that are disposed on the first surface of the body and at least one portion of the third electrode is disposed in the recess.

In one embodiment, the magnetic device according to claim 2, wherein the body is a magnetic body, wherein a coil made of the conductive wire is disposed inside the body.

In one embodiment, an insulating layer is formed on a bottom surface of the magnetic body and is extended to a bottom surface of the recess, wherein the first electrode, the second electrode, and the third electrode are disposed on the insulating layer.

In one embodiment, a peak surface of the third electrode has a first height H1 and a peak surface of the first electrode has a second height H2, relative to a horizontal plane, wherein the difference between H1 and H2 is not greater than 50 um.

In one embodiment, H1−H2 is not greater than 50 um.
In one embodiment, H2−H1 is not greater than 50 um.
In one embodiment, H2−H1 is greater than 0 and less than 50 um.
In one embodiment, H1−H2 is greater than 0 and less than 50 um.
In one embodiment, the conductive wire is an enameled wire.

In one embodiment, the plurality of conductive layers of the third electrode comprises a first conductive layer is formed on the body, a second conductive layer that is formed on the first conductive layer, a third conductive layer that is formed on the second conductive layer, and a fourth conductive layer that is formed on the third conductive layer.

In one embodiment, an insulating layer is formed on the body, wherein a first conductive layer is formed on the insulating layer for shielding the magnetic device.

In one embodiment, the second conductive layer for shielding the magnetic device comprises at least one of the following: Cu, Al, Ni, Fe, Sn, and Ag.

In one embodiment, the second conductive layer for shielding the magnetic device comprises at least one of the following: Fe—Ni, Ferrite, alloy, and nickel.

In one embodiment, a magnetic device is disclosed, wherein the magnetic device comprises: a body, wherein a coil made of a conductive wire is disposed in the body; and a first electrode and a second electrode, wherein the first electrode is disposed on a first portion of a first surface of the body and the second electrode is disposed on a second portion of the first surface of the body, wherein the first electrode and the second electrode are electrically connected to two terminal parts of the conductive wire; and a third electrode, for electrically connecting to a ground, wherein the third electrode comprises a plurality of conductive layers that are disposed on the first surface of the body, wherein a peak surface of the third electrode has a first height H1 and a peak surface of the first electrode has a second height H2, relative to a horizontal plane, wherein the difference between H1 and H2 is not greater than 50 um.

In order to make the aforementioned and other features and advantages of the present invention more comprehensible, several embodiments accompanied by figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

FIG. 2A is an enlarged side view of a magnetic device according to one embodiment of the present invention;

FIG. 2B is an enlarged side view of a magnetic device according to one embodiment of the present invention.

FIG. 2C is an enlarged bottom view of a magnetic device according to one embodiment of the present invention.

FIG. 3A is an enlarged side view of a magnetic device according to one embodiment of the present invention;

FIG. 3B is an enlarged side view of a magnetic device according to one embodiment of the present invention.

FIG. 3C is an enlarged bottom view of a magnetic device according to one embodiment of the present invention.

FIG. 5 illustrates a flow chart of a method for forming the electrodes of a magnetic device according to one embodiment of the present invention;

FIG. 6 illustrates test results of soldering the electrodes with an external circuit according to one embodiment of the present invention.

DESCRIPTION OF EMBODIMENTS

Figure 1:
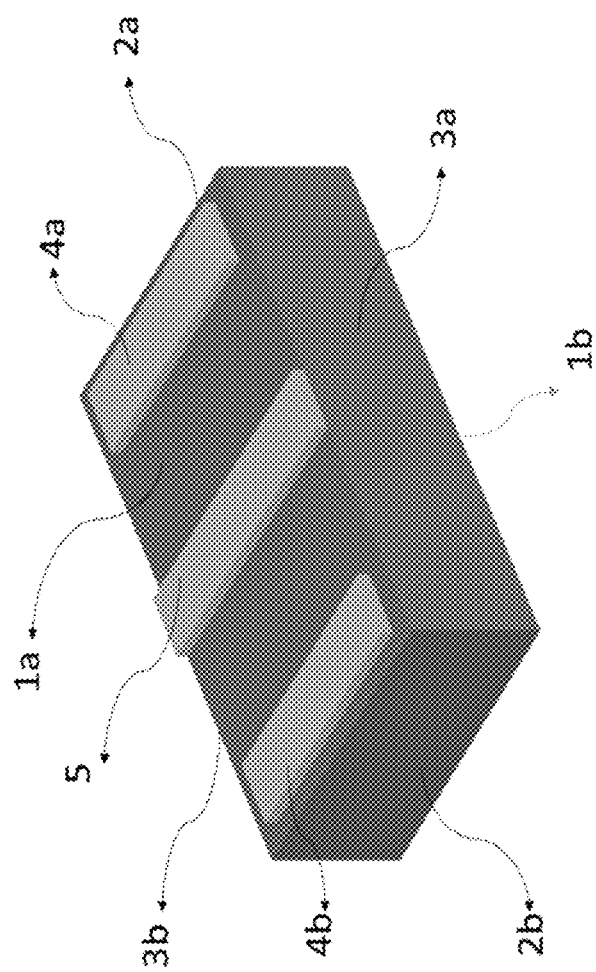
FIG. 1 is an enlarged bottom view of a magnetic device according to one embodiment of the present invention.

FIG. 1 depicts an enlarged bottom view of a magnetic device according to one embodiment of the present invention. As shown in FIG. 1, the bottom surface 1a is the bottom of the magnetic device, wherein electrodes 4a, 4b of the magnetic device, and a ground electrode 5 are disposed on the bottom surface 1a. The other surfaces 1b, 2a, 2b, 3a, 3b can be encapsulated by a shielding layer for reducing leakage of magnetic flux generated by the magnetic device to reduce the electromagnetic interference in a system. The ground electrode 5 can be directly connected to the surface 3a and the surface 3b to form a continuous conductive path from the surface 3a to the surface 3b via the ground electrode 5, as shown in FIG. 1.

FIG. 2A depicts an enlarged cross-sectional view of a magnetic device, FIG. 2B depicts an enlarged cross-sectional view of the placements of the electrodes, and FIG. 2C depicts an enlarged bottom view of the magnetic device according to one embodiment of the present invention, wherein the magnetic device comprises: a body 20, wherein a recess 23 is formed on a first surface with a first protruding portion 21 and a second protruding portion 22 of the body 20 being located at two opposite sides of the recess 23, wherein the protruding portion 21, the second protruding portion 22 and the recess 23 are at a same side of the body 20, wherein a coil 10 made of a conductive wire is disposed in the body 20, wherein the first electrode 4b is disposed on the first protruding portion 21 and the second electrode 4a is disposed on the second protruding portion 22, wherein the first electrode 4b and the second electrode 4a are electrically connected to terminal parts 10a of the conductive wire; and a third electrode 5, for electrically connecting to a ground, wherein at least one portion of the third electrode 5 is disposed in the recess 23.

In one embodiment, a peak surface of the third electrode 5 has a first height H1 and a peak surface of the first electrode 4b has a second height H2, relative to a horizontal plane, wherein the difference between H1 and H2 is not greater than 50 um.

In one embodiment, a peak surface of the third electrode 5 has a first height H1 and a peak surface of the second electrode 4a has a second height H2, relative to a horizontal plane, wherein the difference between H1 and H2 is not greater than 50 um.

In one embodiment, H1−H2 is not greater than 50 um.

In one embodiment, H2−H1 is not greater than 50 um.

In one embodiment, H2−H1 is greater than 0 and less than 50 um.

In one embodiment, H1−H2 is greater than 0 and less than 50 um.

In one embodiment, the magnetic device is an inductor and the body 20 is a magnetic body, wherein a coil 10 formed by the conductive wire is disposed inside the magnetic body 20.

In one embodiment, the conductive wire is an enameled wire that forms the coil 10.

In one embodiment, an insulating layer 30 is formed on the magnetic body 20, wherein the first electrode 4b and the second electrode 4a are disposed on the insulating layer 30.

In one embodiment, the third electrode 5 comprises a plurality of conductive layers that are formed on the bottom surface of the body 20.

In one embodiment, the third electrode 5 comprises a plurality of conductive layers that are formed on the insulating layer 30.

In one embodiment, the third electrode 5 comprises a first conductive layer 40 that is formed on the body 20 by sputtering, a second conductive layer 50 formed on the first conductive layer 40 for shielding the magnetic device, a third conductive layer 41a formed on the second conductive layer 50 by metal such as copper, and a fourth conductive layer 42a formed on the third conductive layer 41a by metal such as nickel and/or sin for soldering with an external circuit.

In one embodiment, the first electrode 4b comprises a conductive layer 41 that can be formed by metal such as copper, and a conductive layer 42 formed on the conductive layer 41 can be formed by metal such as nickel and/or sin for soldering with an external circuit.

In one embodiment, the second electrode 4a comprises a conductive layer 41 that can be formed by metal such as copper, and a conductive layer 42 formed on the conductive layer 41 can be formed by metal such as nickel and/or sin for soldering with an external circuit.

In one embodiment, the first conductive layer 40 extends to the top surface 1b of the body 20 and at least one of the lateral surfaces 2a, 2b, 3a, 3b.

In one embodiment, the second conductive layer 50 extends to the top surface 1b of the body 20 and at least one of the lateral surfaces 2a, 2b, 3a, 3b.

In one embodiment, the first conductive layer 40 extends to the top surface 1b of the body 20 and all of the lateral surfaces 2a, 2b, 3a, 3b.

In one embodiment, the second conductive layer 50 extends to the top surface 1b of the body 20 and all of the lateral surfaces 2a, 2b, 3a, 3b.

In one embodiment, the second conductive layer 50 for shielding the magnetic device comprises at least one of the following: Cu, Al, Ni, Fe, Sn, and Ag.

In one embodiment, the second conductive layer 50 for shielding the magnetic device comprises at least one of the following: Fe—Ni, Ferrite, alloy, and nickel.

In one embodiment, as shown in FIG. 3B, an insulating layer 60 is formed on the second conductive layer 50 between the first electrode 4b and the third electrode 5 and extends to lateral surfaces 2a, 2b, 3a, 3b, and the top surface 1b.

FIG. 3A depicts an enlarged cross-sectional view of a magnetic device, FIG. 3B depicts an enlarged cross-sectional view of the placements of the electrodes and FIG. 3C depicts an enlarged bottom view of the magnetic device according to one embodiment of the present invention, wherein the magnetic device comprises: a body 20, wherein a coil 10 made of a conductive wire is disposed in the body 20, wherein the first electrode 4b is disposed on the first portion and the second electrode 4a is disposed on the second portion of the bottom surface of the body 20, wherein the first electrode 4b and the second electrode 4a are electrically connected to a terminal parts 10a of the conductive wire; and a third electrode 5, for electrically connecting to a ground, wherein a peak surface of the third electrode 5 has a first height H1 and a peak surface of the first electrode 4b has a second height H2, relative to a horizontal plane, wherein the difference between H1 and H2 is not greater than 50 um.

In one embodiment, a peak surface of the third electrode 5 has a first height H1 and a peak surface of the second electrode 4a has a second height H2, relative to a horizontal plane, wherein the difference between H1 and H2 is not greater than 50 um.

In one embodiment, H1−H2 is not greater than 50 um.

In one embodiment, H2−H1 is not greater than 50 um.

In one embodiment, H2−H1 is greater than 0 and less than 50 um.

In one embodiment, H1−H2 is greater than 0 and less than 50 um.

In one embodiment, the conductive wire is an enameled wire that forms the coil 20.

In one embodiment, the magnetic device is an inductor and the body 20 is a magnetic body.

In one embodiment, an insulating layer 30 is formed on the magnetic body 20, wherein the first electrode 4b and the second electrode 4a are disposed on the insulating layer 30.

In one embodiment, the third electrode 5 comprises a plurality of conductive layers that are formed on the bottom surface of the body 20.

In one embodiment, the third electrode 5 comprises a plurality of conductive layers that are formed on the insulating layer 30.

In one embodiment, the third electrode 5 comprises a first conductive layer 40 that is formed on the body 20, a second conductive layer 50 that is formed on the first conductive layer 40, a third conductive layer 41a that can be formed by copper, and a fourth conductive layer 42a that can be formed by nickel and/or sin for soldering with an external circuit.

In one embodiment, the first conductive layer 40 is made of metal.

In one embodiment, the second conductive layer 50 is made of metal.

In one embodiment, the first electrode 4b comprises a conductive layer 41 that is formed on the body 20 and a conductive layer 42 that is formed on the conductive layer 41.

In one embodiment, the second electrode 4a comprises a conductive layer 41 that is formed on the body 20 and a conductive layer 42 that is formed on the conductive layer.

In one embodiment, the first electrode 4b comprises a conductive layer 41 that is formed on the insulating layer 30 that is formed on the magnetic body 20 and a conductive layer 42 that is formed on the conductive layer 41.

In one embodiment, the second electrode 4a comprises a conductive layer 41 that is formed on the insulating layer 30 that is formed on the magnetic body 20 and a conductive layer 42 that is formed on the conductive layer 41.

In one embodiment, the conductive layer 41 can be formed by copper, and the conductive layer 42 can be formed by nickel and/or sin for soldering with an external circuit.

In one embodiment, the second conductive layer 50 for shielding the magnetic device comprises at least one of the following: Cu, Al, Ni, Fe, Sn, and Ag.

In one embodiment, the second conductive layer 50 for shielding the magnetic device comprises at least one of the following: Fe—Ni, Ferrite, alloy, and nickel.

In one embodiment, the first conductive layer 40 extends to the top surface 1b of the body 20 and the four lateral surfaces 2a, 2b, 3a, 3b of the body.

In one embodiment, the first conductive layer 40 is made of metal that is electroplated on the body 20 for shielding the magnetic device.

In one embodiment, the first conductive layer 40 is made of metal that is sputtered on the body 20 for shielding the magnetic device.

In one embodiment, the first conductive layer 40 is made of conductive and adhesive material that is coated on the body 20.

In one embodiment, the second conductive layer 50 is made of metal that is electroplated on the first conductive layer 40.

In one embodiment, the second conductive layer 50 is made of conductive and adhesive material that is coated on the first conductive layer 40.

Figure 4:
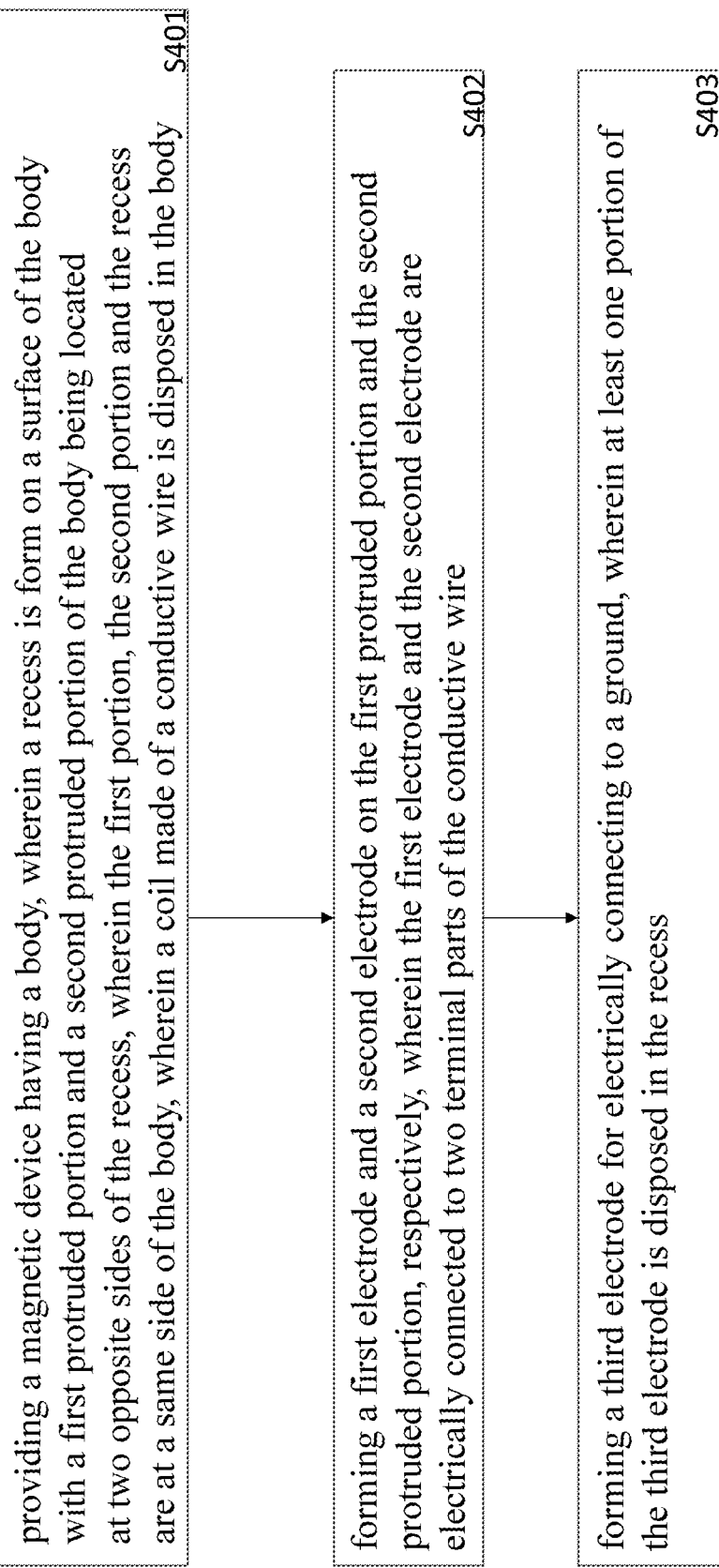
FIG. 4 illustrates a flow chart of a method for forming the electrodes of a magnetic device according to one embodiment of the present invention.

FIG. 4 depicts a flow chart of a method for forming electrodes of a magnetic device according to one embodiment of the present invention, wherein the method comprises: step S401: providing a magnetic device having a body, wherein a recess is formed on a first surface of the body with a first protruding portion and a second protruding portion of the body being located at two opposite sides of the recess, wherein the first portion, the second portion, and the recess are at a same side of the body, wherein a coil made of a conductive wire is disposed in the body; step S402: forming a first electrode and a second electrode on the first protruding portion and the second protruding portion, respectively, wherein the first electrode and the second electrode are electrically connected to two terminal parts of the conductive wire; and step S403: forming a third electrode for electrically connecting to a ground, wherein at least one portion of the third electrode is disposed in the recess.

FIG. 5 depicts a flow chart of a method for forming electrodes of a magnetic device according to one embodiment of the present invention, wherein the method comprises: step S501: providing a magnetic device having a body, wherein a coil made of a conductive wire is disposed in the body; and step S502: forming a first electrode and a second electrode on a first portion and a second portion of the body, respectively, wherein the first electrode and the second electrode are electrically connected to two terminal parts of the conductive wire; and step S503: forming a third electrode for electrically connecting to a ground, wherein a peak surface of the third electrode has a first height H1 and a peak surface of the first electrode has a second height H2, relative to a horizontal plane, wherein the difference between H1 and H2 is not greater than 50 um.

FIG. 6 illustrates test results when soldering the electrodes with an external circuit according to one embodiment of the present invention, wherein the coplanarity between the third electrode 5 and the electrodes 4a, 4b of the magnetic devices such as an inductor is in a range of 0 to 50 um, and the difference between H1 and H2 is not greater than 50 um, wherein the soldering results are all passed without failures, as shown in FIG. 6.

When the difference between the H2 and H1 is greater than 50 um, it will increase the risk that the ground electrode 5 or the electrodes 4a, 4b will not be tinned during the welding process, as a result, the difference between the H2 and H1 is not greater than 50 um can prevent soldering failures when soldering all of the above electrodes with an external circuit.

Figure 7:
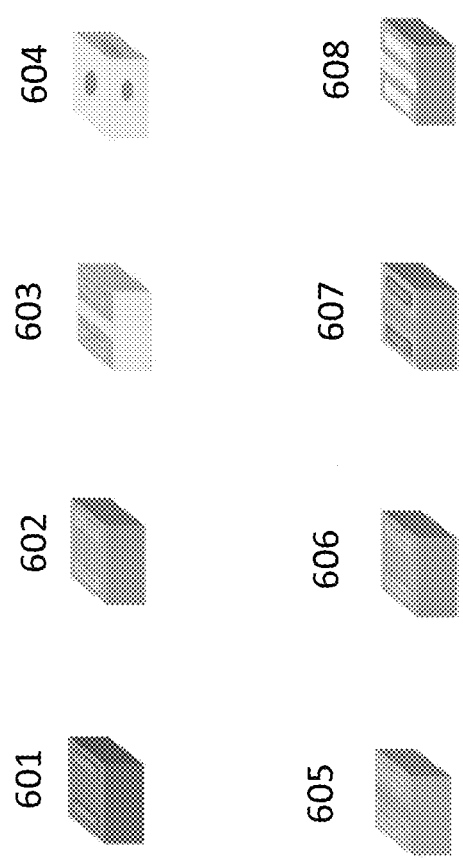
FIG. 7 illustrates a method for forming the magnetic device according to one embodiment of the present invention.

FIG. 7 illustrates a method for forming the magnetic device according to one embodiment of the present invention, wherein the method comprises: in step 601: providing a magnetic device having a magnetic body; in step 602: forming a first insulating layer on the magnetic body; and in step 603: forming a first conductive layer on the insulating layer for shielding the magnetic device, wherein the first conductive layer extends from a top surface of the insulating layer to a bottom surface of the insulating layer; in step 604: removing at least one portion of the at least one first conductive layer to provide an exhaust channel for moisture inside the magnetic body to leak to the outside of the magnetic body, thereby preventing the residual moisture from deforming the inductor due to thermal expansion. In addition, in step 605: plating Cu/Ni metal layer over the first conductive layer; in step 606: plating Cu/Ni metal layer over the first conductive layer; forming a second insulating layer over the Cu/Ni metal layer; in step 607: remove portions of the second insulating layer to expose the electrodes; and in step 608; plating Cu or printing Ag/Ni/Sn on the electrodes.

In one embodiment, the first conductive layer 40 extends to the top surface 1*b* of the body 20, wherein the first conductive layer covers at least 90% of the total area of the top surface 1*b* of the body 20, wherein at least one portion of the top surface 1*b* of the body 20 is exposed from the first conductive layer 40 to provide an exhaust channel for moisture inside the body 20 to leak to the outside of the body.

In one embodiment, the first conductive layer 40 covers at least 93% of the total area of the top surface 1*b* of the body 20, wherein at least one portion of the top surface 1*b* of the body 20 is exposed from the first conductive layer 40 to provide an exhaust channel for moisture inside the body 20 to leak to the outside of the body 20.

In one embodiment, the second conductive layer 50 extends to the top surface 1*b* of the body 20, wherein the second conductive layer 50 covers at least 90% of the total area of the top surface 1*b* of the body 20, wherein at least one portion of the top surface 1*b* of the body 20 is exposed from the second conductive layer 50 to provide an exhaust channel for moisture inside the body to leak to the outside of the body 20.

In one embodiment, the second conductive layer 50 extends to the top surface 1*b* of the body 20, wherein the second conductive layer 50 covers at least 93% of the total area of the top surface 1*b* of the body 20, wherein at least one portion of the top surface 1*b* of the body 20 is exposed from the second conductive layer 50 to provide an exhaust channel for moisture inside the body 20 to leak to the outside of the body 20.

Although the present invention has been described with reference to the above embodiments, it will be apparent to one of ordinary skill in the art that modifications to the described embodiment may be made without departing from the spirit of the invention. Accordingly, the scope of the invention will be defined by the attached claims, not by the above-detailed descriptions.

What is claimed is:

1. A magnetic device, comprising:
   a body, having a first surface, wherein a recess is formed on the first surface with a first protruding portion and a second protruding portion of the body being located at two opposite sides of the recess, wherein the first protruding portion, the second protruding portion, and the recess are at a same side of the body, wherein a conductive wire is disposed in the body;
   a first electrode and a second electrode, wherein the first electrode is disposed on the first protruding portion and the second electrode is disposed on the second protruding portion, wherein the first electrode and the second electrode are electrically connected to two terminal parts of the conductive wire, respectively; and
   a third electrode, for electrically connecting to a ground, wherein the third electrode comprises a plurality of conductive layers disposed on the first surface of the body with at least one portion of the third electrode being disposed in the recess.

2. The magnetic device according to claim 1, wherein the magnetic device is an inductor, wherein the body is a magnetic body, and a coil made of the conductive wire is disposed inside the magnetic body.

3. The magnetic device according to claim 1, wherein the first surface is a bottom surface of the body, wherein an insulating layer is formed on the bottom surface of the body and is extended to a bottom surface of the recess, wherein the first electrode, the second electrode, and the third electrode are disposed on the insulating layer.

4. The magnetic device according to claim 1, wherein a peak surface of the third electrode has a first height H1 and a peak surface of the first electrode has a second height H2, relative to a horizontal plane, wherein $0 \leq H2-H1 \leq 50$ um.

5. The magnetic device according to claim 1, wherein the plurality of conductive layers of the third electrode comprises a first conductive layer formed on the body, a second conductive layer formed on the first conductive layer, a third conductive layer formed on the second conductive layer, and a fourth conductive layer formed on the third conductive layer.

6. The magnetic device according to claim 3, wherein the plurality of conductive layers of the third electrode comprises a first conductive layer formed on the insulating layer, a second conductive layer formed on the first conductive layer, a third conductive layer formed on the second conductive layer, and a fourth conductive layer formed on the third conductive layer.

7. The magnetic device according to claim 5, wherein the second conductive layer is used for shielding the magnetic device.

8. The magnetic device according to claim 7, wherein the second conductive layer for shielding the magnetic device comprises at least one of the following: Cu, Al, Ni, Fe, Sn, and Ag.

9. The magnetic device according to claim 7, wherein the second conductive layer for shielding the magnetic device comprises at least one of the following: Fe-Ni, Ferrite, alloy, and nickel.

* * * * *